(12) United States Patent
Morrow

(10) Patent No.: US 11,536,782 B1
(45) Date of Patent: Dec. 27, 2022

(54) RING TYPE TRANSDUCER ASSEMBLIES AND METHODS

(71) Applicant: STRESS ENGINEERING SERVICES, INC., Mason, OH (US)

(72) Inventor: Daniel L. Morrow, Batavia, OH (US)

(73) Assignee: STRESS ENGINEERING SERVICES, INC., Mason, OH (US)

( * ) Notice: Subject to any disclaimer, the term of this patent is extended or adjusted under 35 U.S.C. 154(b) by 0 days.

(21) Appl. No.: 17/864,959

(22) Filed: Jul. 14, 2022

Related U.S. Application Data

(60) Provisional application No. 63/334,343, filed on Apr. 25, 2022.

(51) Int. Cl.
　G01R 33/07 (2006.01)
　F41B 5/14 (2006.01)
　G01L 1/00 (2006.01)
　G01R 33/00 (2006.01)

(52) U.S. Cl.
　CPC .......... G01R 33/072 (2013.01); F41B 5/1403 (2013.01); G01L 1/005 (2013.01); G01R 33/0047 (2013.01)

(58) Field of Classification Search
　CPC . G01R 33/072; G01R 33/0047; F41B 5/1403; G01L 1/005; G01D 5/145
　See application file for complete search history.

(56) References Cited

U.S. PATENT DOCUMENTS 5,435,292 A * 7/1995 Armstrong ............ F41B 5/1434
　　　　　　　　　　　　　　　　124/900
8,286,871 B2 * 10/2012 Bay ..................... F41G 1/467
　　　　　　　　　　　　　　　　235/407
2009/0229381 A1 * 9/2009 Fujimoto ............ A61B 5/6885
　　　　　　　　　　　　　　　　356/614

FOREIGN PATENT DOCUMENTS

RU　　　2504330 C2 *　1/2014 ............... A61B 5/11

OTHER PUBLICATIONS

Rivest, Christopher W.; "Design and Characterization of a Low Cost Dual Differential Proving Ring Force Sensor Utilizing Hall-Effect Sensors"; Massachusetts Institute of Technology; 2006.
"The Proving Ring Design"; National Institute of Standards and Technology; downloaded from https://www.nist.gov/pml/quantum-measurement/mass-and-force/proving-ring-design; Created Sep. 11, 2009, Updated Nov. 26, 2019.

* cited by examiner

Primary Examiner — Jay Patidar
(74) Attorney, Agent, or Firm — Ulmer & Berne LLP

(57) ABSTRACT

A transducer assembly includes a ring wall, a first arm, a second arm, a magnet, and a Hall effect sensor. The ring wall defines a bore. The first and second arms are disposed within the bore and include first and second proximal and distal ends, respectively. The first and second proximal ends are coupled to and extend from first and second interior locations of the ring wall, respectively. The second interior location is spaced from the first interior location. The magnet is disposed within the bore and is fixedly coupled to the first arm. The Hall effect sensor is disposed within the bore and is fixedly coupled to the second arm. The Hall effect sensor is spaced from the magnet and is configured to detect movement of the magnet resulting from compression of the ring wall. Methods are also provided.

20 Claims, 8 Drawing Sheets

RING TYPE TRANSDUCER ASSEMBLIES AND METHODS

REFERENCE TO RELATED APPLICATION

This application claims priority of U.S. provisional patent application Ser. No. 63/334,343 filed Apr. 25, 2022, entitled "Load Cells, Methods And Apparatus Having Same," and hereby incorporates this provisional patent application by reference herein in its entirety.

TECHNICAL FIELD

The transducer assemblies and methods described herein facilitate measurement of forces within a load path.

BACKGROUND

Conventional apparatus and methods for measurement of loads within a load path can exhibit a form factor, size, operation, and/or other configurational aspect(s) that render them ineffective for implementation within certain applications.

SUMMARY

In accordance with one embodiment, a transducer assembly comprises a ring wall, a first arm, a second arm, a magnet, and a Hall effect sensor. The ring wall defines a bore. The first arm is disposed within the bore and comprises a first proximal end and a first distal end. The first proximal end is coupled to and extends from a first interior location of the ring wall. The second arm is disposed within the bore and comprises a second proximal end and a second distal end. The second proximal end is coupled to and extends from a second interior location of the ring wall. The second interior location is spaced from the first interior location. The magnet is disposed within the bore and is fixedly coupled to the first arm. The Hall effect sensor is disposed within the bore and is fixedly coupled to the second arm. The Hall effect sensor is spaced from the magnet and is configured to detect movement of the magnet resulting from compression of the ring wall.

In accordance with another embodiment, a method comprises attaching a transducer assembly to a flexible cord, wherein the flexible cord comprises a first strand and a second strand. A load is applied to the flexible cord, resulting in compression of a ring wall of the transducer assembly between the first strand and the second strand. A Hall effect sensor of the transducer assembly detects movement of a magnet of the transducer assembly resulting from the compression. Each of the Hall effect sensor and the magnet are disposed within a bore defined by the ring wall. The method further comprises receiving an electrical signal from the Hall effect sensor and identifying, based upon the electrical signal, an amount of the load applied to the flexible cord.

BRIEF DESCRIPTION OF THE DRAWINGS

It is believed that certain embodiments will be better understood from the following description taken in conjunction with the accompanying drawings in which.

DETAILED DESCRIPTION

Figure 6:
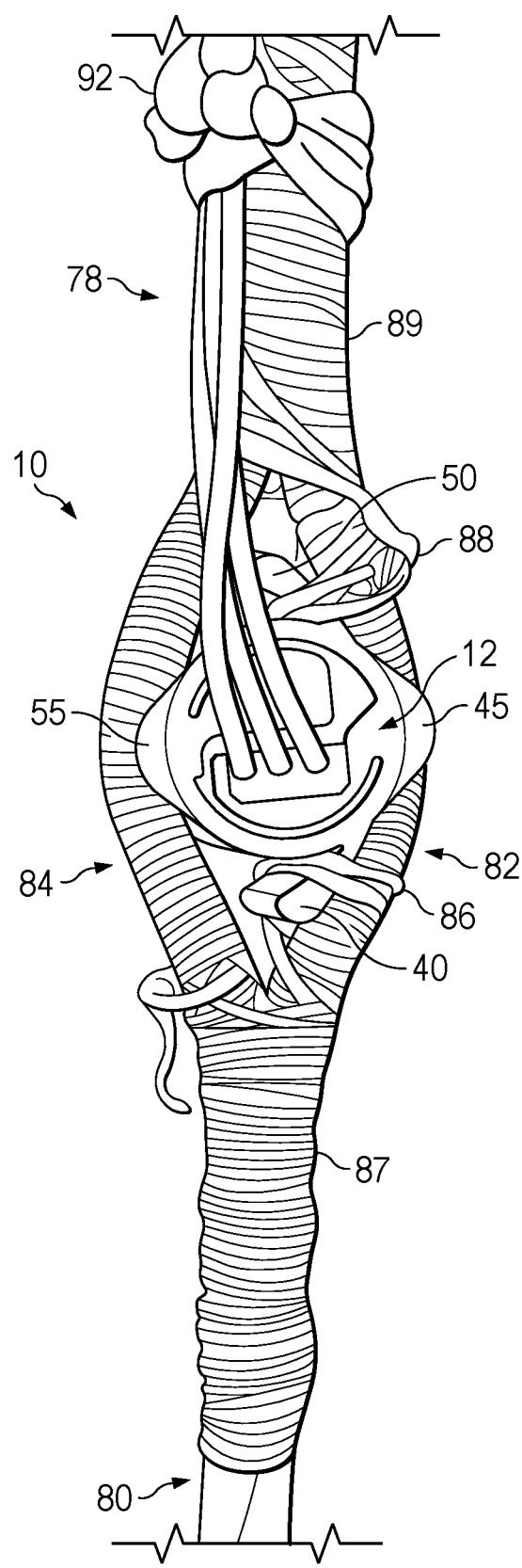
FIG. 6 is a bottom view depicting a transducer assembly including the component(s) of FIG. 1 in combination with other components, and attached to a flexible cord in accordance with one embodiment.
Figure 7:
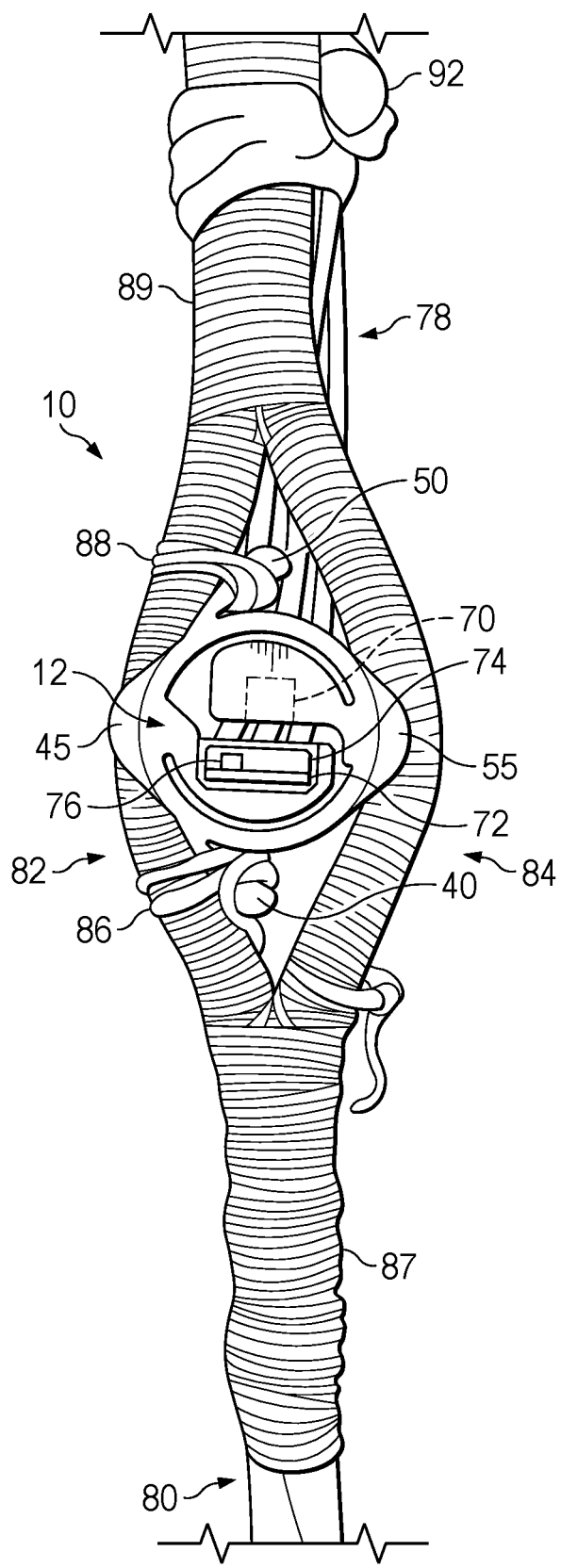
FIG. 7 is a top view depicting the arrangement of FIG. 6.

Transducer assemblies are described in connection with the views and examples of FIGS. 1-8, wherein like numbers indicate the same or corresponding elements throughout the views. A load cell or transducer assembly 10 in accordance with a first embodiment is described herein with reference to FIGS. 1-8. The transducer assembly 10 is shown in FIGS. 6-7 to include, for example, a ring wall 12, a magnet 70, and a Hall effect sensor 74. In one embodiment, the magnet 70 comprises a permanent magnet, though in other embodiments a magnet can be an electromagnet or otherwise.

In one embodiment, as shown in the example of FIGS. 1-5, the ring wall 12 defines a bore 14. While the ring wall 12 is shown to comprise a continuous circumferential structure provided generally in the shape of an "O", it will be appreciated that in alternative embodiments a ring wall may have a different shape, or may be formed as a multi-piece structure such as wherein one or more circumferential portions of the "O" are provided by filler material(s).

With reference to FIGS. 1-5, the transducer assembly 10 can further include a first arm 20 and a second arm 30 which are shown to be disposed within the bore 14, with each being coupled with the ring wall 12. More particularly, the first arm 20 is shown to extend from a proximal end 22 to a distal end 24, with the proximal end 22 being coupled to and extending from a first interior location of the ring wall 12. Likewise, the second arm 30 is shown to extend from a proximal end 32 to a distal end 34, with the proximal end 32 being coupled to and extending from a second interior location of the ring wall 12. In the illustrated configuration, it can be seen that the second interior location can be spaced from the first interior location. More particularly, the first interior location is shown to be disposed generally oppositely from the second interior location.

As can be seen in FIGS. 1-5, the distal end 24 of the first arm 20 can extend toward the second interior location of the ring wall 12, but without touching the second interior location or other portion of the ring wall 12. The distal end 34 of the second arm 30 can extend toward the first interior location of the ring wall 12, but without touching the first interior location or other portion of the ring wall 12. In this configuration, it will be appreciated that the distal ends 24 and 34 can be free from contacting or dragging against the ring wall 12 or other portions of the transducer assembly 10 during compression of the ring wall 12 as described subsequently herein.

As further shown in the shown in the example of FIGS. 1-5, a first wing or leg 40 and a second wing or leg 50 are shown to be disposed outside of or opposite the bore 14, with each being coupled with the ring wall 12. More particularly, the first leg 40 is shown to extend from an inner end 42 to an outer end 44, with the inner end 42 being coupled to and extending from a first exterior location of the ring wall 12, and the outer end 44 being spaced from the ring wall 12. Likewise, the second leg 50 is shown to extend from an inner end 52 to an outer end 54, with the inner end 52 being coupled to and extending from a second exterior location of the ring wall 12, and the outer end 54 being spaced from the ring wall 12. In the illustrated configuration, it can be seen that the second exterior location can be spaced from the first exterior location. More particularly, the first exterior location is shown to be disposed generally oppositely from the second exterior location.

In accordance with one embodiment, the ring wall 12 can include a first strand interface structure and a second strand interface structure. Still referring to the example of FIGS. 1-5, the first strand interface structure is shown to include a set of fins 45 and an exterior bearing surface 48 which are each disposed outside of or opposite the bore 14. The set of fins 45 can cooperate with the exterior bearing surface 48 to define an exterior groove 46 disposed outside of or opposite the bore 14, and at a location between the first leg 40 and the second leg 50. The second strand interface structure is shown to include a set of fins 55 and an exterior bearing surface 58 which are each disposed outside of or opposite the bore 14. The set of fins 55 can cooperate with the exterior bearing surface 58 to define an exterior groove 56 disposed outside of or opposite the bore 14. In the illustrated configuration, it can be seen that the second strand interface structure can spaced from the first strand interface structure, such that the exterior groove 56 is spaced from the exterior groove 46. More particularly, the first strand interface structure is shown to be disposed generally oppositely from the second strand interface structure, such that the exterior groove 56 is disposed generally oppositely from the exterior groove 46.

Figure 1:
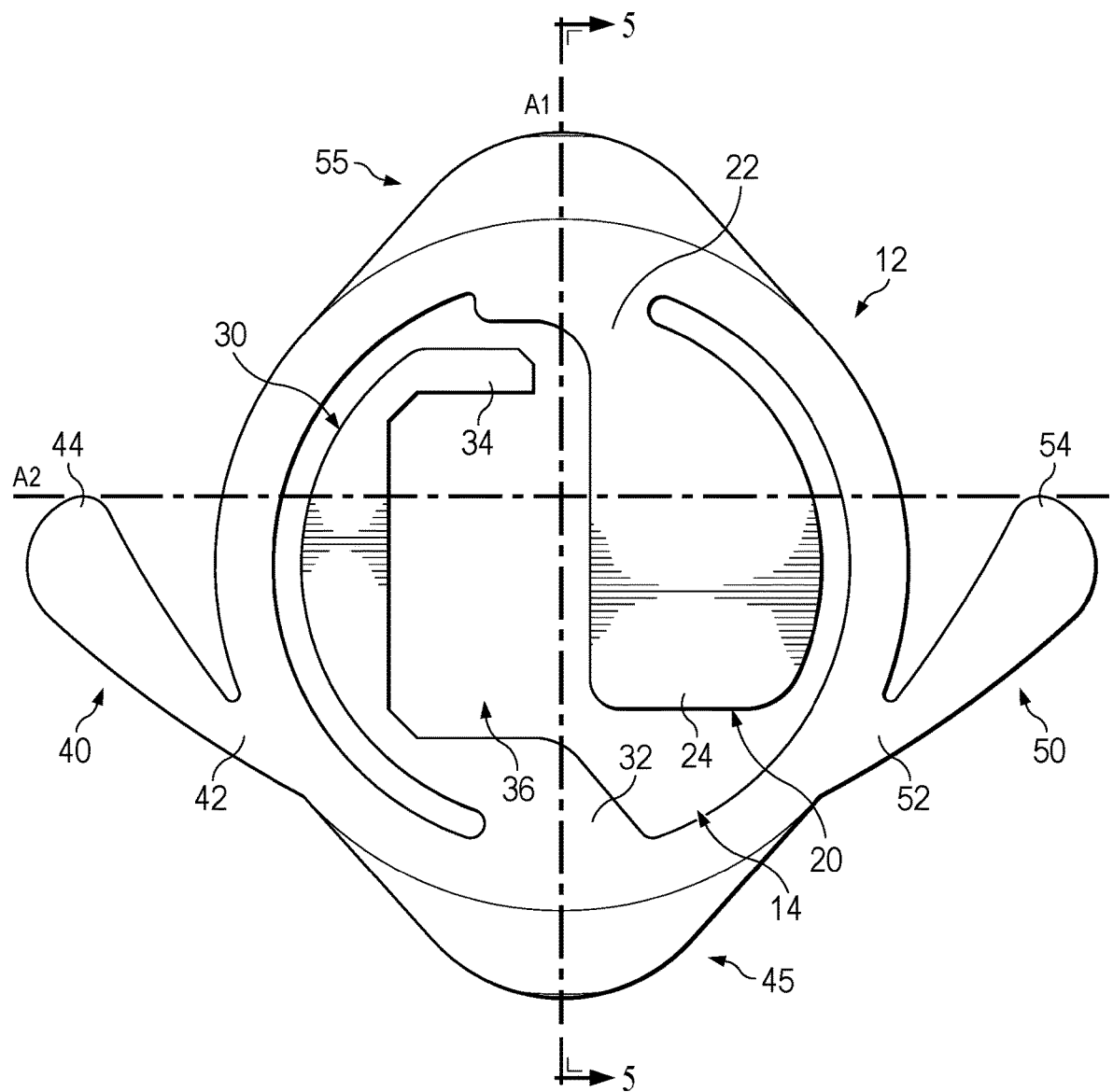
FIG. 1 is a top plan view depicting certain components of a transducer assembly in accordance with one embodiment.
Figure 2:
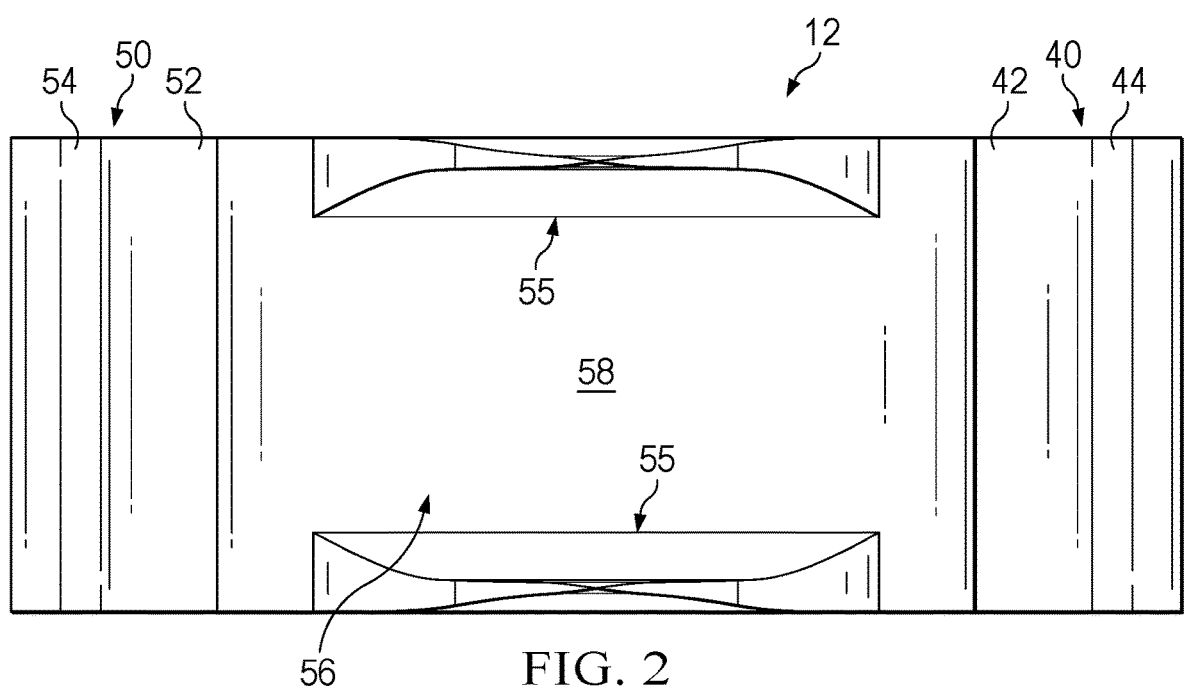
FIG. 2 is a rear elevational view depicting the components of FIG. 1.
Figure 3:
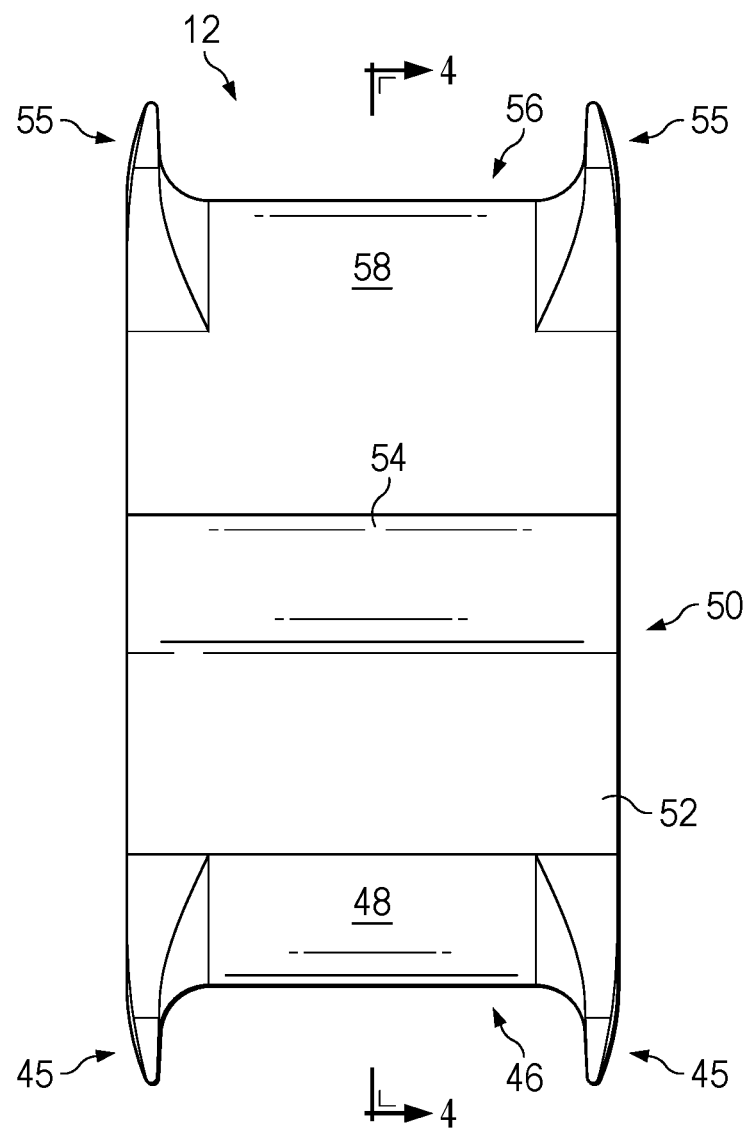
FIG. 3 is a side elevational view depicting the components of FIG. 1.

In one embodiment, the first interior location and the second interior location, from which the first and second arms 20 and 30 respectively extend from the ring wall 12 into the bore 14, can each be bisected by a first axis A1 (FIG. 1). In this configuration, the exterior groove 46 and the exterior groove 56 can also be bisected by the first axis A1 (FIG. 1). The outer end 44 of the first leg 40 and the outer end 54 of the second leg 50 can be aligned on a second axis A2 (FIG. 1). It will be appreciated that, in one embodiment, such as shown by FIG. 1, the first axis A1 and the second axis A2 can intersect one another. More particularly, as will be appreciated with reference to FIG. 1, the first axis A1 can perpendicularly intersect the second axis A2 at a location within and, for example, generally central to the bore 14.

Arrangement of various components of the transducer assembly 10, in accordance with one embodiment, can be appreciated with reference to the top elevational view provided in FIG. 1, with positions of degree identified counterclockwise relative thereto. In particular, according to this embodiment, the first interior location from which the first arm 20 extends from the ring wall 12 into the bore 14, is shown to be disposed at about a 0 degree position of the ring wall 12. The second strand interface structure and its exterior groove 56 (FIG. 3) is likewise shown to be disposed at about a 0 degree position of the ring wall 12. The second interior location from which the second arm 30 extends from the ring wall 12 into the bore 14, is shown to be disposed at about a 180 degree position of the ring wall 12. The first strand interface structure and its exterior groove 46 (FIG. 3) is likewise shown to be disposed at about a 180 degree position of the ring wall 12. Further in this configuration, the second exterior location, from which the second leg 50 extends from the ring wall 12, is shown to be disposed at about a 135 degree position of the ring wall 12. The first exterior location, from which the first leg 40 extends from the ring wall 12, is shown to be disposed at about a 225 degree position of the ring wall 12. With reference to FIG. 1, it can be seen that the first axis A1 can bisect both the 0 degree position of the ring wall 12 and the 180 degree position of the ring wall 12, while the second axis A2 can bisect both the 90 degree position of the ring wall 12 and the 270 degree position of the ring wall 12.

In one embodiment, as illustrated in FIGS. 1-5, the ring wall 12, the first arm 20, the second arm 30, the first leg 40, and the second leg 50 can be integrally formed as a unitary structure such as from steel, aluminum, titanium, another metal, an alloy thereof, or from another material such as plastic, carbon fiber, wood, fiberglass, or another material or combination thereof. For example, the ring wall 12, the first arm 20, the second arm 30, the first leg 40, and the second leg 50 can be machined or direct metal laser sintering (DMLS) 3D printed from titanium. In other embodiments, one or more of these components can be formed separately and attached to the others such as with welding, adhesive, and/or interlocking mechanical features.

Referring now to FIGS. 4-7, it can be seen that the magnet 70 can be disposed within the bore 14 and fixedly coupled to the first arm 20 adjacent to the distal end 24 of the first arm 20. In one embodiment, the first arm 20 can define a receptacle 26 configured to receive the magnet 70. While not required, provision of the receptacle 26 can facilitate convenient provisioning of the magnet 70 in a desired orientation relative to the first arm 20, so as to facilitate reliable and efficient manufacturing of the associated transducer assembly 10. Adhesive can be provided to facilitate fixed coupling of the magnet 70 to the first arm 20 and within the receptacle 26. For example, the adhesive can comprise an epoxy resin or potting compound which can be configured to seal and provide protection to the magnet 70. In this configuration and when fully assembled as shown in FIGS. 6-7, it will be appreciated that the magnet 70 can fully reside within the bore 14 and thus be prevented from being contacted or damaged by components external of the transducer assembly 10.

Likewise and with reference to FIGS. 4-7, the Hall effect sensor 74 can be disposed within the bore 14 and fixedly coupled to the second arm 30 adjacent to the distal end 34 of the second arm 30. More particularly, and in the example of FIGS. 1-7, it can be seen that the Hall effect sensor 74 can be mounted to a circuit board 72. The circuit board 72 can be disposed within the bore 14 and fixedly coupled to the second arm 30, such as within a receptacle 36 defined by the second arm 30 at a location adjacent to the distal end 34 of the second arm 30. While not required, provision of the receptacle 36 can facilitate convenient provisioning of the Hall effect sensor 74 in a desired orientation relative to the second arm 30, so as to facilitate reliable and efficient manufacturing of the associated transducer assembly 10. In addition to the Hall effect sensor 74, the circuit board 72 can support a capacitor 76 (FIG. 7) which can be electrically coupled with the Hall effect sensor 74. Wires 78 can also be electrically coupled with the circuit board 72. Adhesive can be provided to facilitate fixed coupling of the circuit board 72, the Hall effect sensor 74 and the capacitor 76 to the second arm 30 and within the receptacle 36. For example, the adhesive can comprise an epoxy resin or potting compound which can be configured to seal and provide protection to the circuit board 72, the Hall effect sensor 74 and the capacitor 76. In this configuration and when fully assembled as shown in FIGS. 6-7, it will be appreciated that the circuit board 72, the Hall effect sensor 74 and the capacitor 76 can fully reside within the bore 14 and thus be prevented from being contacted or damaged by components external of the transducer assembly 10.

Figure 4:
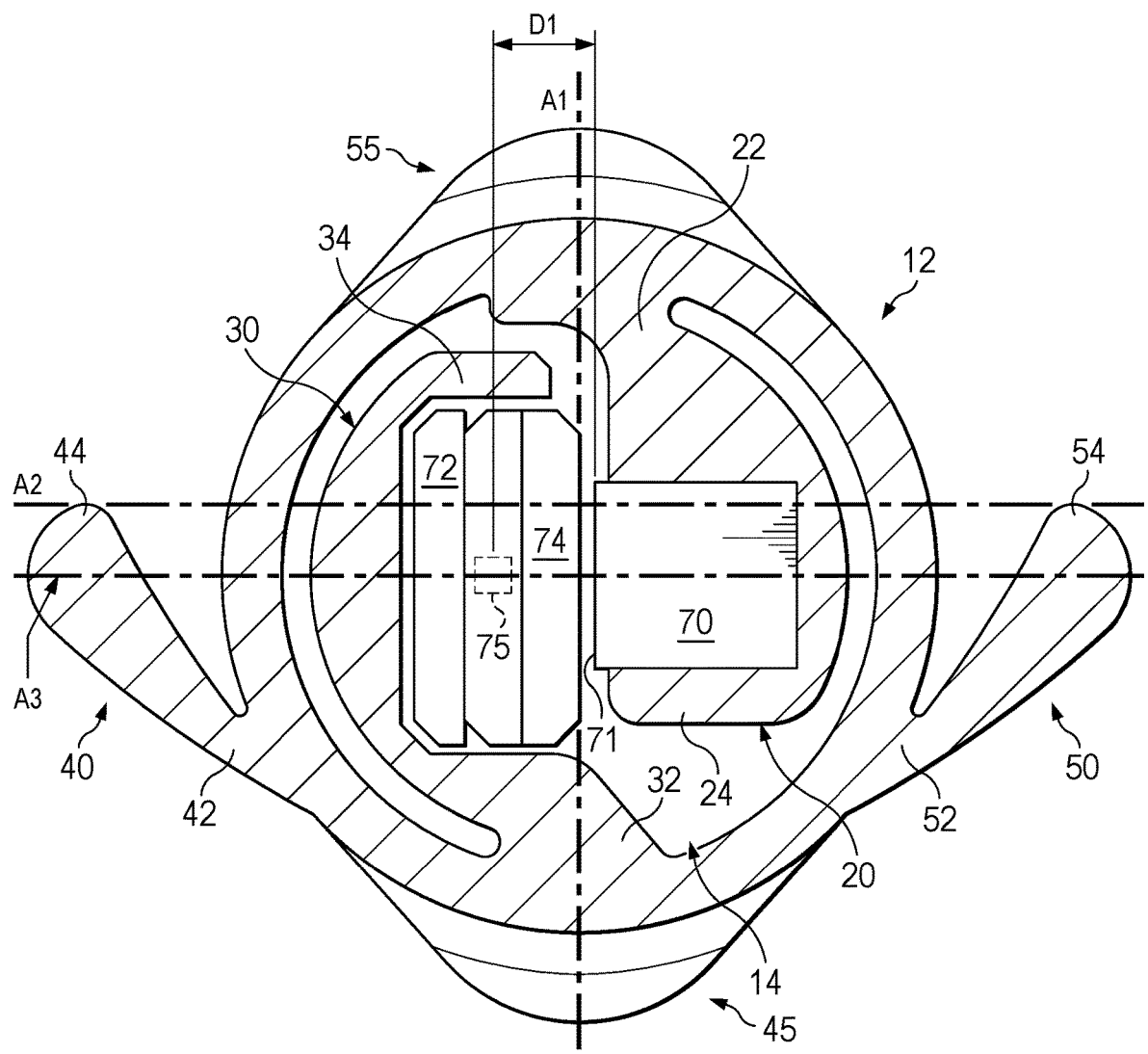
FIG. 4 is a cross-sectional view taken along the line 4-4 in FIG. 3, but with a circuit board, Hall effect sensor and magnet additionally depicted.
Figure 5:
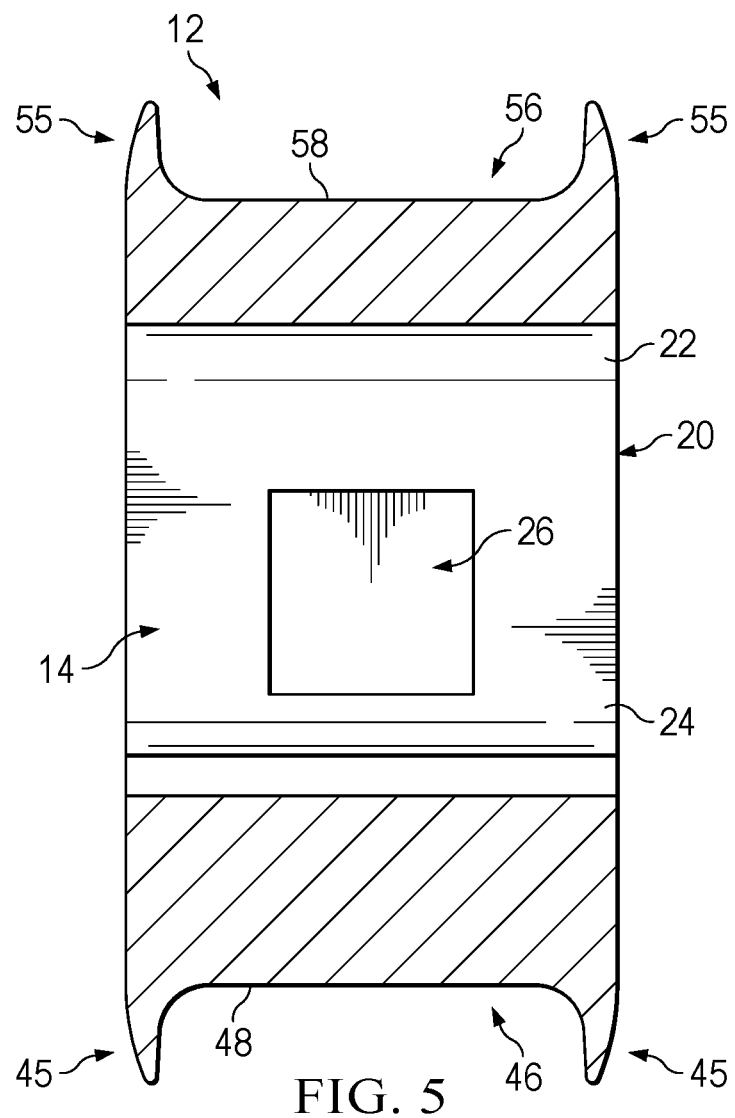
FIG. 5 is a cross-sectional view taken along the line 5-5 in FIG. 1.

When assembled in this manner, the Hall effect sensor 74 can be spaced from the magnet 70 to produce a design-specific total effective gap (TEG). More particularly, with the Hall effect sensor 74 provided in the package of a chip as generally shown in FIG. 4, it will be appreciated that a Hall effect element 75 can be provided at a precise location by the manufacturer (within a few microns) within the chip. It can be seen in FIG. 4 that respective centroids of both the Hall effect element 75 and the magnet 70 can lie upon an axis A3 which can bisect the axis A1 at the center of the bore 14, and can be parallel with the axis A2. The total effective gap is shown in FIG. 4 to be measured by dimension D1 as the distance between the Hall effect element 75 and a face 71 of the magnet 70. The total effective gap is a design parameter that, for any given magnet, determines the level of magnetic saturation/strength that an associated Hall effect element will experience, and therefore can affect or determine what sensitivity of the associated Hall effect element is desired or required. It will be appreciated that, when the ring wall 12 is compressed during use of the transducer assembly 10, the first arm 20 can move relative to the second arm 30, thus causing the magnet 70 to move (e.g., slide by) relative to the Hall effect sensor 74. The Hall effect sensor 74 can be configured to detect the relative movement (e.g., slide by movement) of the magnet 70 resulting from compression of the ring wall 12.

In other embodiments, it will be appreciated that the positions of a magnet and Hall effect sensor can be reversed, such that a magnet is coupled with a second arm of a transducer assembly while a Hall effect sensor is coupled with the first arm of the transducer assembly. It will also be appreciated that, in other embodiments, a magnet and a Hall effect sensor can be coupled to respective first and second arms of a transducer assembly in any of a variety of other suitable configurations, which may or may not involve use of receptacle(s) and/or adhesive(s).

A transducer assembly as described herein can be associated with an element provided directly within a load path, thereby itself being capable of measuring characteristics of a load experienced by that element in the particular application. For example, in the arrangement of FIG. 6-8, through attachment to the flexible cord 80, the transducer assembly 10 can monitor loading experienced by the flexible cord 80. More particular, it can be seen in FIGS. 6-7 that the transducer assembly 10 can be positioned and retained, in a predetermined orientation, between a first strand 82 and a second strand 84 of the flexible cord 80. In one embodiment, it will be appreciated that the flexible cord 80 comprises a braided or other woven configuration of the first strand 82 and the second strand 84.

To facilitate attachment of the transducer assembly 10 to the flexible cord 80, the transducer assembly 10 can be positioned such that a portion of the first strand 82 is received within the exterior groove 46 and in contact with the exterior bearing surface 48 of the ring wall 12, and a portion of the second strand 84 is received within the exterior groove 56 and in contact with the exterior bearing surface 48 of the ring wall 12, as shown in FIGS. 6-7. The sets of fins 45 can be configured to prevent departure of the portion of the first strand 82 from the exterior groove 46, and the sets of fins 55 can be configured to prevent departure of the portion of the second strand 84 from the exterior groove 56. The first strand 82 can be attached, e.g., by serving, to the first leg 40 such as with a string or tie 86 wrapped about them. Likewise, the first strand 82 can be attached, e.g., by serving, to the second leg 50 such as with a string or tie 88 wrapped about them. It will be appreciated that such anchorage of the first leg 40 and the second leg 50 (using serving or some other method) can ensure optimal alignment of the transducer assembly 10 relative to the flexible cord 80 in use thereof. In this configuration and with reference to FIGS. 1, 4, and 6-7, the respective contact points between the ring wall 12 and each of the first strand 82 and the second strand 84 can be fixed (e.g., 180 degrees apart from each other, in complete alignment with axis A1) to facilitate corresponding and consistent slide-by of the magnet 70 relative to the Hall effect sensor 74 upon compression of the ring wall 12 resulting from tension on the flexible cord 80. If legs (e.g., 40 and 50) were not provided, a transducer assembly can be free to randomly rotate relative to a flexible cord, resulting in lack of reliable and consistent correspondence between compression of a ring wall and slide-by motion between a magnet and Hall effect sensor. For example, if a transducer assembly rotates a full 90 degrees from its intended position relative to strands of a flexible cord, compression of the ring wall (e.g., along axis A3) can result in no or negligible slide-by motion between a magnet and Hall effect sensor. Additional servings or wrappings 87 and 89 can be provided about the flexible cord 80 at locations adjacent to opposite sides of the transducer assembly 10, as shown in FIGS. 6-7, to further secure the transducer assembly 10 in place relative to the flexible cord 80. One or more additional servings or ties (e.g., 92 in FIGS. 6-7) can additionally be provided to facilitate securement of any wires (e.g., 78) leading from the transducer assembly 10.

Figure 8:
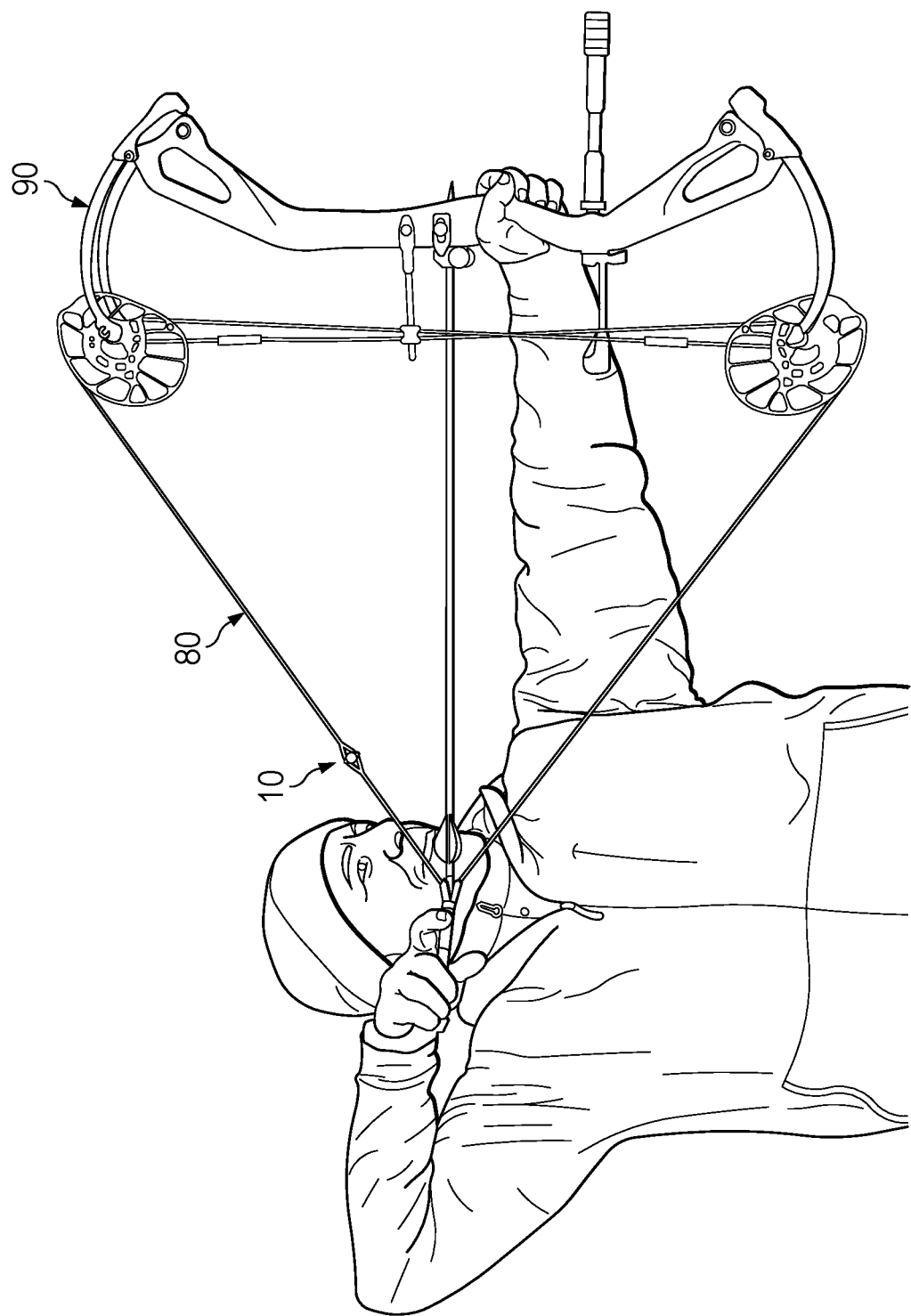
FIG. 8 illustrates the arrangement of FIG. 6 provided upon an archery bow in accordance with one embodiment.

By way of example, FIG. 8 illustrates use of the flexible cord 80 in association with a bow frame 90, such that the transducer assembly 10 is shown to be positioned along the flexible cord 80 at a location similar to that which would be suitable to support a conventional peep sight. It will be appreciated, however, that the transducer assembly 10 can be positioned in any of a variety of other suitable locations along a flexible cord associated with a bow frame. With the transducer assembly 10 so positioned, when a user retracts the flexible cord 80 as shown in FIG. 8, a load is applied to the flexible cord 80 which can result in corresponding compression of the ring wall 12 of the transducer assembly 10 between the first strand 82 and the second strand 84 of the flexible cord 80. This compression can result in temporary distortion of the ring wall 12 from an "0" shape to more of an ovular shape, which can result in relative movement of the first arm 20 relative to the second arm 30 and corresponding movement (e.g., slide by movement) of the magnet 70 relative to the Hall effect sensor 74. The Hall effect sensor 74 can detect this movement of the magnet 70 and can generate and transmit an electrical signal reflecting the magnitude of this movement. Based upon this electrical signal received from the Hall effect sensor 74, associated electronics (not shown) can identify and display to a user an amount of the load applied to the flexible cord 80.

Assuming that the configuration and material of the ring wall 12 are suitably selected for a particular application, it will be appreciated that such compression of the ring wall 12 can be temporary in response to application of the force, and that the ring wall 12 will resume its typical non-distorted configuration (as shown in FIGS. 1-5) upon removal of the compression. In one embodiment, it will be appreciated that the amount of distortion of the ring wall 12 can be in linear or non-linear proportion to the amount of force applied to the flexible cord 80 depending upon, for example, the configuration and material of the ring wall 12.

It will be appreciated that the amount of compressive deflection of the ring wall 12 resulting from application of force to the flexible cord 80 can be determined based upon factors such as the specific shape of the ring wall 12, the dimensions (e.g., height and thickness) of various locations about the circumference of the ring wall 12, and the material forming the ring wall 12. Engineering design of the ring wall 12 can be accomplished for specific applications of the transducer assembly 10 to ensure that the ring wall 12 is strong enough to survive without permanent deformation under any compression it will receive in normal use, yet flexible enough to allow adequate compliance to facilitate measurable deflection to accomplish measurement of such compression. If the ring wall 12 is too weak for a particular application, the ring wall 12 can permanently deform in use, resulting in subsequent inoperability of the transducer assembly 10. However, if the ring wall 12 is too strong, the ring wall 12 may not adequately compress to facilitate measurement thereof. The ring wall 12 can therefore optimally be over-designed by a specific amount in order allow some distortion yet withstand permanent deformation in response to a particular compression, e.g., by a factor of about 1 to about 5, by a factor of about 2 to about 4, by a factor of about 2.5, or by another factor. For example, the ring wall 12 can be designed to reliably sustain a load of about 150 pounds applied to the flexible cord 80, even though in use the load will not exceed about 60 pounds, thereby resulting in a factor of 2.5. In this example, the ring wall 12 can experience compressions large enough to facilitate measurements through use of the Hall effect as described herein, but stresses that are low enough so that it will survive without deformation in use.

While the embodiment of FIGS. 4 and 6-7 illustrates the Hall effect sensor 74 and capacitor 76 being attached to the circuit board 72, it will be appreciated that, in other embodiments, a transducer assembly can instead include a custom packaged Hall effect sensor assembly which includes an internal capacitor, and from which wires (e.g., similar to 78) can directly extend. The custom packaged Hall effect sensor assembly can have a size, form factor and shape that beneficially corresponds with the desired characteristics of the transducer assembly and can, for example, have some similarity to that of a standard package such as SOT23, TO-92, TO252, TO220, or otherwise. It will be appreciated that a custom packaged Hall effect sensor can individually be expensive when ordered in small quantities (e.g., less than 100,000 units). But when budgets and/or quantities can justify, use of a custom packaged Hall effect sensor within a transducer assembly might generally be deemed a more elegant solution. However, in relatively low quantities, use of a conventional off-the-shelf Hall effect sensor can just as effectively be used, such as by mounting it to a custom-designed circuit board (e.g., as shown in FIGS. 6-7).

In one embodiment, wires 78 can include three distinct wires, namely a power wire, a ground wire and a signal wire. Power can be provided to the Hall effect sensor 74 through use of the power wire and the ground wire. In use, the Hall effect sensor 74 can produce an electrical signal indicative of the amount of compression of the ring wall 12, which can be transmitted by and received from the Hall effect sensor 74 by way of the signal wire such as in the form of a 0-5 V, 4-20 mA, PWM, or binary data signal corresponding to its measured position of the magnet 70. In an alternative embodiment, it will be appreciated that fewer than three or more than three wires can lead to a Hall effect sensor of a transducer assembly. For example, in one alternative embodiment, only a single wire can lead to a Hall effect sensor, thereby providing power thereto, in which case ground can be received by the Hall effect sensor through a conductive flexible cord, and a signal can then be selectively superimposed by the Hall effect sensor upon the single wire or transmitted wirelessly from the Hall effect sensor assembly. In yet another alternative embodiment, a Hall effect sensor assembly can be configured not to receive any wires, and instead can comprise power harvesting circuit and/or data communications circuits (e.g., near field communications) within its package. Based upon an electrical signal received through the wires (e.g., 78) or wirelessly from the Hall effect sensor 74, an amount of compression applied to the transducer assembly 10, e.g., by a flexible cord, can be identified.

In conventional applications, high precision force determinations often involve use of strain gauges which are glued or otherwise attached onto force-bearing structural members. Monitoring of changes in resistance of the strain gauges can reveal the amount of compression and force associated with the structural members. Strain gauges can provide challenges in application because they can be difficult to position and attach, have a relatively large form factor, have a tendency to fail or be damaged easily, require relatively complex signal processing circuitry, require relatively significant power for operation, and are relatively expensive.

In the examples described herein, a transducer assembly can be designed to allow for compression under load, such as by allowing compression of the ring wall 12. In this way and by allowing for compression, the transducer assemblies as described herein can be analogous to conventional sensors involving a strain gauge configuration, but instead the measurement is accomplished through use of magnets and Hall effect sensors. Use of a Hall effect sensor in a transducer assembly can provide advantages as compared with use of a strain gauge. For example, while Hall effect sensors can be suitably used as described above, it can be difficult to obtain and/or reliably position a strain gauge into the very small spaces required of certain embodiments of the transducer assemblies as described herein (e.g., see FIGS. 6-7). Also, while Hall effect sensors can be energy efficient and provide high level output signals, strain gauges require excessive energy and can require signal processing and/or amplification to reach suitable high levels. Furthermore, the transducer assemblies as described herein can be constructed through use of inexpensive, readily available, off-the-shelf Hall effect sensors (see e.g., FIGS. 6-7).

More particularly, while Hall effect sensors can be used in a head on or slide by configuration, the illustrated embodiments employ use of a Hall effect sensor in a slide by configuration. The unique geometry of the transducer assembly configurations facilitate sliding of the magnet by and relative to the Hall effect sensor to represent forces associated with loads upon the transducer assemblies. In certain configurations of a transducer assembly as described herein, under normal intended loading of the transducer assembly, the amount of slide by movement of the magnet relative to the Hall effect sensor, can be on the order of less than about 0.010 inch, less than about 0.005 inch, or less than about 0.001 inch. It will be appreciated that these are very small amounts of movement, not typically perceivable by the human eye, well within suitable parameters for reliable design, and normally experienced by typical components of a mechanical system. In other embodiments, it will be appreciated that a transducer assembly can involve use of a Hall effect sensor in a head on configuration.

In the above examples, the Hall effect sensor provides an output signal based upon movement of the magnetic field, resulting from relative movement between the magnet and the Hall effect sensor resulting from loading of the transducer assembly. The resulting output signal from the Hall effect sensor can be provided as a function of deflection and corresponding load. For example, a transducer assembly can be configured such that a Hall effect sensor provides a 0-6 volt output signal in response to a 0-150 pound load. In one embodiment, the output signal can be linear over this range, though in another embodiment associated circuitry can be suitably calibrated to account for any nonlinearity of the output signal. In this example, in a linear configuration, if an output signal of 3 volts is provided by the Hall effect sensor, associated circuitry can determine that 75 pounds of load is provided upon the transducer assembly. In such a configuration, the transducer assembly can be configured to provide an output signal that linearly corresponds to the amount of tension on the string or other flexible cord, thereby facilitating ease of understanding and efficient integration of the transducer assembly into diagnostics systems.

It will be appreciated that a specific Hall effect sensor and magnet combination can be selected for a transducer assembly based upon engineering considerations involving: the intended loading, characteristics and environment of the transducer assembly; the desired strength and shape of the magnetic field produced by the magnet; the range, sensitivity and output signal configurations of the Hall effect sensor; the total effective gap (e.g., longitudinal spacing) between the Hall effect sensor and the magnet; and the desired monitoring circuitry to be employed.

It will be appreciated that, by associating the transducer assembly 10 with an element directly within a load path, as shown in FIGS. 6-8, the transducer assembly 10 can directly measure characteristics of a load experienced by that element in the particular application, without experiencing friction or interference which may be introduced by other ancillary structures. For example, in certain conventional configurations, frictional losses must otherwise be taken into account to approximate changes in tension or force applied to a flexible cord. Unlike such conventional configurations, provision of the transducer assembly 10 into the load path as described herein can facilitate a more direct and reliable measurement and approximation of changes in tension or force applied to a flexible cord.

It will be appreciated that, as described above with reference to FIGS. 6-8, a transducer assembly 10 in accordance herewith can effectively monitor operation of an archery bow as described in U.S. Pat. No. 10,281,229, issued on May 7, 2019, the entire disclosure of which is hereby incorporated by reference herein in its entirety. More particularly, a transducer assembly as described herein can be implemented with archery bows to facilitate the monitoring systems and methods of U.S. Pat. No. 10,281,229. In such configurations, the transducer assembly 10 can be provided as a factory-installed component of an archery bow, or instead can be provided as an aftermarket accessory capable of easily and inexpensively fitting onto an existing archery bow by an end user.

The transducer assembly 10 can accordingly be configured as a string tensiometer which is configured to measure tension on a string or other flexible cord, as described above. The small size of a transducer assembly as described herein facilitates its effective embedment in a string or other flexible cord, without impacting desired or normal operation of the string or other flexible cord. Also, the light weight of the transducer assembly facilitates minimization of dynamic loading in use. While FIG. 8 illustrates use of a transducer assembly in association with an archery bow, it will be appreciated that a transducer assembly as disclosed herein can be advantageously implemented in any of a variety of other suitable force measurement applications, such as by association with a flexible or non-flexible element provided directly in a load path. For example, it will be appreciated that transducer assemblies as described herein can be used in any of a variety of applications other than archery bows, including for example, vehicles, manufacturing machinery, consumer goods, tools, cabling systems, and otherwise. It will further be appreciated that a transducer assembly might not be configured for attachment to a flexible cord, but might instead be configured for attachment to another type of flexible force transmission apparatus (e.g., a chain) or to another force transmitting element. It will be appreciated, upon review of the various embodiments illustrated and described, that a transducer assembly in accordance with the present disclosure can be provided in any of a variety of suitable alternative configurations, yet still being within the scope of the disclosure provided herein.

The foregoing description of embodiments and examples of the disclosure has been presented for purposes of illustration and description. It is not intended to be exhaustive or to limit the disclosure to the forms described. Numerous modifications are possible in light of the above teachings. Some of those modifications have been discussed and others will be understood by those skilled in the art. The embodiments were chosen and described in order to best illustrate the principles of the disclosure and various embodiments as are suited to the particular use contemplated. The scope of the disclosure is, of course, not limited to the examples or embodiments set forth herein, but can be employed in any number of applications and equivalent devices by those of ordinary skill in the art. Rather it is hereby intended the scope of the invention be defined by the claims appended hereto. Also, for any methods claimed and/or described, regardless of whether the method is described in conjunction with a flow diagram, it should be understood that unless otherwise specified or required by context, any explicit or implicit ordering of steps performed in the execution of a method does not imply that those steps must be performed in the order presented and may be performed in a different order or in parallel.

What is claimed is:

1. A transducer assembly comprising:
    a ring wall defining a bore;
    a first arm disposed within the bore, the first arm comprising a first proximal end and a first distal end, the first proximal end coupled to and extending from a first interior location of the ring wall;
    a second arm disposed within the bore, the second arm comprising a second proximal end and a second distal end, the second proximal end coupled to and extending from a second interior location of the ring wall, the second interior location being spaced from the first interior location;
    a magnet disposed within the bore and fixedly coupled to the first arm; and
    a Hall effect sensor disposed within the bore and fixedly coupled to the second arm; wherein
    the Hall effect sensor is spaced from the magnet and is configured to detect movement of the magnet resulting from compression of the ring wall.

2. The transducer assembly of claim 1 further comprising:
a first leg disposed opposite the bore, the first leg comprising a first inner end and a first outer end, the first inner end coupled to and extending from a first exterior location of the ring wall; and
a second leg disposed opposite the bore, the second leg comprising a second inner end and a second outer end, the second inner end coupled to and extending from a second exterior location of the ring wall.

3. The transducer assembly of claim 2 wherein the ring wall defines:
a first exterior groove disposed opposite the bore; and
a second exterior groove disposed opposite the bore.

4. The transducer assembly of claim 3 wherein:
the first interior location is disposed generally oppositely from the second interior location;
the first exterior location is disposed generally oppositely from the second exterior location; and
the first exterior groove is disposed generally oppositely from the second exterior groove.

5. The transducer assembly of claim 4 wherein:
the first interior location is disposed at about a 0 degree position of the ring wall;
the second interior location is disposed at about a 180 degree position of the ring wall;
the first exterior groove is disposed at about a 180 degree position of the ring wall; and
the second exterior groove is disposed at about a 0 degree position of the ring wall.

6. The transducer assembly of claim 5 wherein:
the first exterior location is disposed at about a 225 degree position of the ring wall; and
the second exterior location is disposed at about a 135 degree position of the ring wall.

7. The transducer assembly of claim 6 wherein:
the first outer end is spaced from the ring wall;
the second outer end is spaced from the ring wall; and
the first outer end and the second outer end are aligned on an axis, such that the axis bisects the ring wall at about a 90 degree position and at about a 270 degree position.

8. The transducer assembly of claim 3 wherein the ring wall comprises:
a first exterior bearing surface disposed opposite the bore;
a second exterior bearing surface disposed opposite the bore;
a first set of fins disposed opposite the bore and cooperating with the first exterior bearing surface to define the first exterior groove; and
a second set of fins disposed opposite the bore and cooperating with the second exterior bearing surface to define the second exterior groove.

9. The transducer assembly of claim 3 wherein the ring wall, the first arm, the second arm, the first leg, and the second leg are integrally formed as a unitary structure.

10. The transducer assembly of claim 1 wherein:
the magnet is fixedly coupled to the first arm adjacent to the first distal end; and
the Hall effect sensor is fixedly coupled to the second arm adjacent to the second distal end.

11. The transducer assembly of claim 1 wherein:
the first distal end extends toward the second interior location of the ring wall; and
the second distal end extends toward the first interior location of the ring wall.

12. The transducer assembly of claim 1 wherein the magnet is configured to slide by the Hall effect sensor upon compression of the ring wall.

13. The transducer assembly of claim 1 wherein the ring wall, the first arm, and the second arm are integrally formed as a unitary structure.

14. The transducer assembly of claim 1 further comprising a circuit board, a capacitor, and adhesive, each being disposed within the bore, wherein:
the Hall effect sensor is mounted to the circuit board;
the capacitor is mounted to the circuit board;
a first portion of the adhesive secures the magnet to the first arm; and
a second portion of the adhesive secures the circuit board to the second arm.

15. The transducer assembly of claim 1 wherein:
the ring wall defines a first exterior groove and a second exterior groove;
the first interior location and the second interior location are each bisected by a first axis;
the first exterior groove and the second exterior groove are each bisected by the first axis; and
the ring wall, the first arm, and the second arm are integrally formed as a unitary structure.

16. The transducer assembly of claim 15 further comprising:
a first leg disposed opposite the bore, the first leg comprising a first inner end and a first outer end, the first inner end coupled to and extending from a first exterior location of the ring wall; and
a second leg disposed opposite the bore, the second leg comprising a second inner end and a second outer end, the second inner end coupled to and extending from a second exterior location of the ring wall; wherein
the first outer end is spaced from the ring wall;
the second outer end is spaced from the ring wall;
the first outer end and the second outer end are aligned on the second axis;
the first axis intersects the second axis at a location generally central to the bore; and
the ring wall, the first arm, the second arm, the first leg, and the second leg are integrally formed as a unitary structure.

17. A method comprising:
attaching a transducer assembly of claim 1 to a flexible cord, wherein the flexible cord comprises a first strand and a second strand;
applying a load to the flexible cord, resulting in compression of the ring wall of the transducer assembly between the first strand and the second strand;
detecting, by the Hall effect sensor of the transducer assembly, movement of the magnet of the transducer assembly resulting from the compression;
receiving an electrical signal from the Hall effect sensor; and
identifying, based upon the electrical signal, an amount of the load applied to the flexible cord.

18. The method of claim 17 wherein the attaching comprises serving.

19. The method of claim 17 wherein the attaching comprises:
attaching each of a first leg and a second leg to the first strand, wherein each of the first leg and the second leg is integrally formed as a unitary structure with the ring wall and extends from the ring wall opposite the bore;
receiving a portion of the first strand within a first exterior groove in the ring wall, the first exterior groove being disposed between the first leg and the second leg; and
receiving a portion of the second strand within a second exterior groove in the ring wall.

20. The method of claim 17 wherein the movement comprises sliding of the magnet by the Hall effect sensor.

* * * * *